(12) United States Patent
Vassighi et al.

(10) Patent No.: US 9,024,647 B2
(45) Date of Patent: May 5, 2015

(54) SEQUENTIAL BURN-IN TEST MECHANISM

(75) Inventors: Arman Vassighi, Chandler, AZ (US);
Victor Zia, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 342 days.

(21) Appl. No.: 13/600,474

(22) Filed: Aug. 31, 2012

(65) Prior Publication Data

US 2014/0062515 A1    Mar. 6, 2014

(51) Int. Cl.
    *G01R 31/10*           (2006.01)
    *G01R 31/28*           (2006.01)
    *G01R 31/317*         (2006.01)

(52) U.S. Cl.
    CPC ........ *G01R 31/2875* (2013.01); *G01R 31/2879* (2013.01); *G01R 31/31721* (2013.01)

(58) Field of Classification Search
    USPC .................. 324/750.01–750.3, 762.01–762.1
    See application file for complete search history.

(56) References Cited

U.S. PATENT DOCUMENTS 6,160,411 A * 12/2000 Eliashberg et al. ...... 324/750.05
6,788,083 B1 * 9/2004 Siddiqui et al. .......... 324/750.05
7,111,211 B1 * 9/2006 Co et al. ........................ 714/718

\* cited by examiner

*Primary Examiner* — Tung X Nguyen
(74) *Attorney, Agent, or Firm* — Blakely, Sokoloff, Taylor & Zafman LLP

(57) ABSTRACT

A method includes performing a burn-in test on an integrated circuit (IC) by removing power from a first component block within the IC and applying a maximum burn-in voltage and temperature to a second component block within the IC.

14 Claims, 4 Drawing Sheets

SEQUENTIAL BURN-IN TEST MECHANISM

FIELD OF THE INVENTION

The present disclosure generally relates to integrated circuits, and more particularly, to testing integrated circuits.

BACKGROUND

Integrated circuits (ICs) are designed to operate under a variety of environmental conditions. For example, ICs are designed to operate over a range of temperatures. To ensure that an IC operates correctly, the integrated circuit is coupled to a test system for testing. One process used to test the reliability of an IC device is the burn-in process. The burn-in process features placing the IC device under stress to determine if the device will fail. However, existing burn-in platforms have limited power capability in terms of both delivering required power for an IC die under burn-in conditions (higher voltage and temperature) and for removing the generated heat on the die.

To enable the burn-in test for such devices, the burn-in voltage and temperature is typically reduced to lower the power consumption, which significantly increases the burn-in time. Options to reduce the test time have been limited due to an inability to remove the heat as fast as it is generated, hence risking burning of the IC device.

DETAILED DESCRIPTION

In the following description, numerous specific details are set forth in order to provide a thorough understanding of various embodiments. However, various embodiments of the invention may be practiced without the specific details. In other instances, well-known methods, procedures, component blocks, and circuits have not been described in detail so as not to obscure the particular embodiments of the invention.

Reference in the specification to "one embodiment" or "an embodiment" means that a particular feature, structure, or characteristic described in connection with the embodiment may be included in at least an implementation. The appearances of the phrase "in one embodiment" in various places in the specification may or may not be all referring to the same embodiment.

Figure 1:
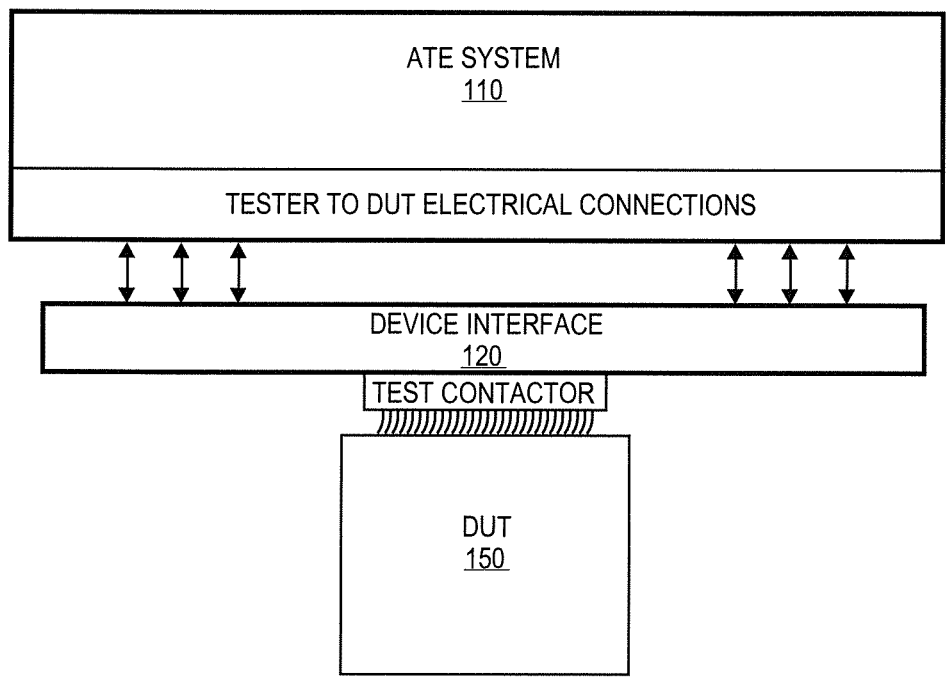
FIG. 1 illustrates one embodiment of a test system.

FIG. 1 illustrates a conventional test system 100. System 100 includes an automated test equipment (ATE) system 110 implemented to perform testing on a device under test (DUT) 150. DUT 150 may be an IC die on a wafer, or a packaged part. In one embodiment, ATE system 110 is coupled to DUT 150 via a device interface 120 and test contactor 130.

According to one embodiment, ATE system 110 performs a burn-in test on DUT 150. In such an embodiment, ATE system 110 uses component blocks on DUT 150 to perform a sequential burn-in process. The sequential burn-in process enables burn-in screening of DUT 150 even though the burn-in power of DUT 150 may exceed the power capability of ATE 150.

Figure 2:
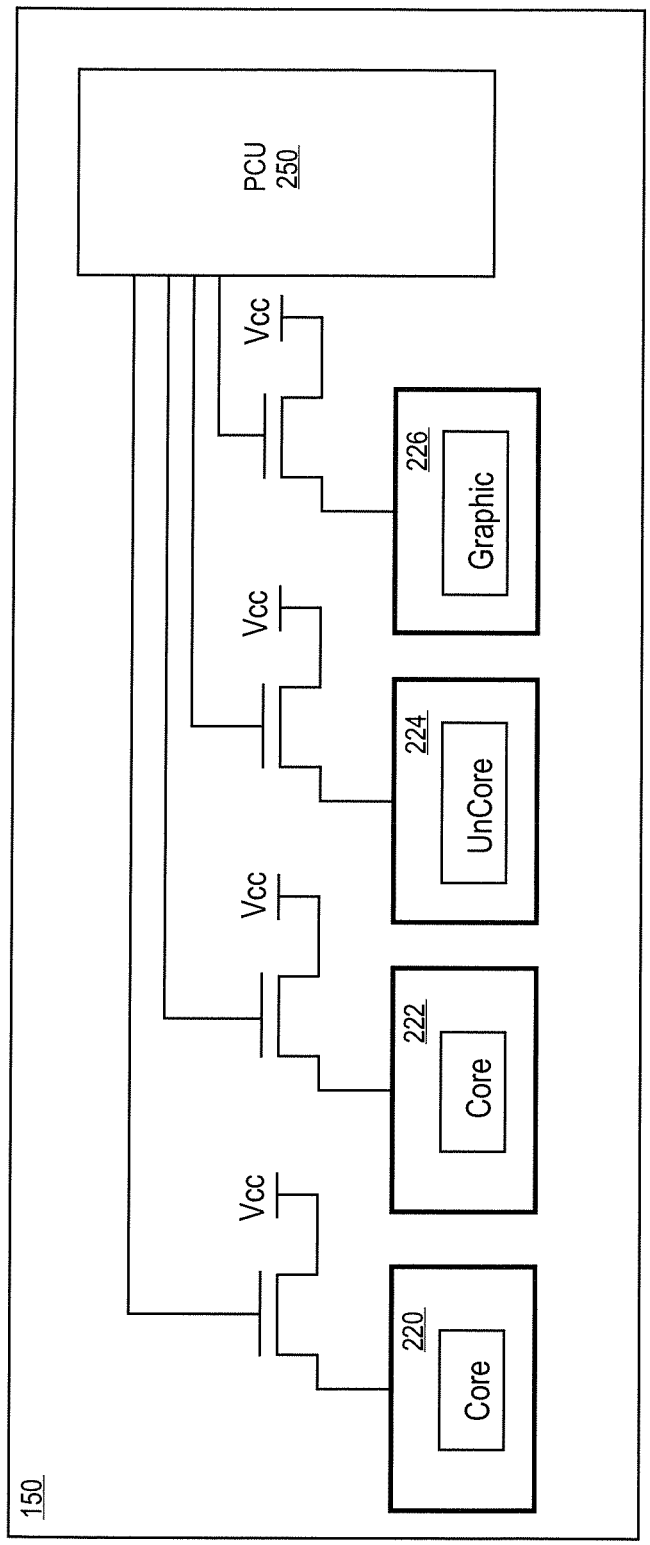
FIG. 2 illustrates one embodiment of an IC.

FIG. 2 illustrates one embodiment of DUT 150. As shown in FIG. 2, DUT 150 includes a power control unit (PCU) 250 coupled to control power to various IC component blocks 220 via gate transistors associated with each component block 220. Each gate transistor is coupled to a voltage source (Vcc). Thus, PCU 250 has the ability to power voltage on/off a component block by transmitting an enable signal to the corresponding transistor. In one embodiment, such component blocks include processing cores 220 and 222, an uncore 224 and graphics core 226.

According to one embodiment, sequential burn-in uses PCU 250 to sequentially remove power voltage different component blocks on DUT and apply maximum burn-in voltage and temperature to the rest of the circuits on the die without exceeding the platform power capability. Since at any given time part of DUT 150 is turned off, the total power requirement on burn-in platform decreases.

Figure 3:
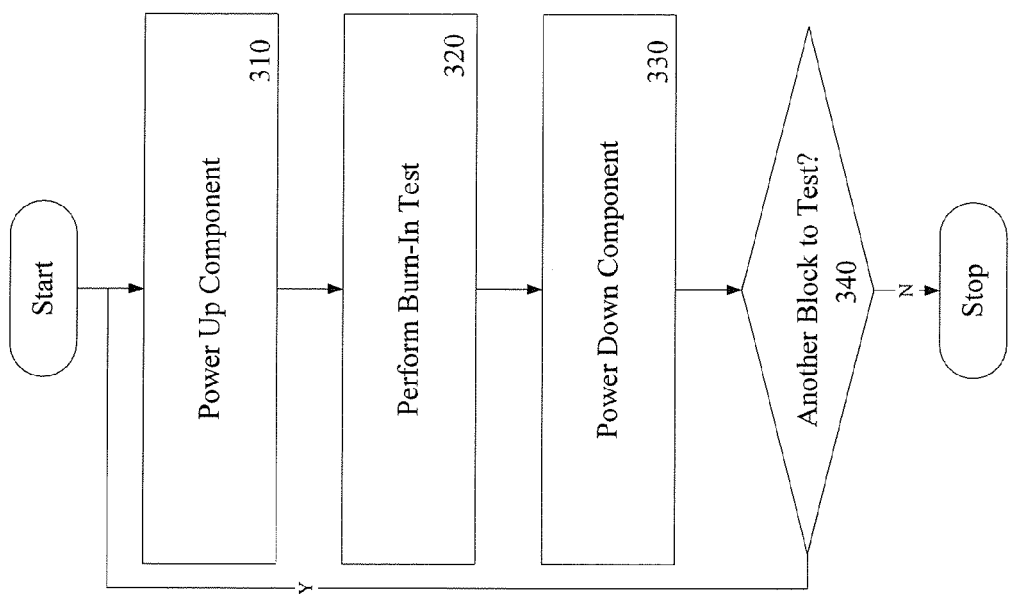
FIG. 3 is a flow diagram illustrating one embodiment of a sequential burn-in process.

FIG. 3 is a flow diagram illustrating one embodiment of a sequential burn-in process. At processing block 310, a first component block (e.g., core 220) is powered up by PCU 250 upon PCU 250 transmitting an enable signal to the corresponding gate transistor, while the remaining component blocks remain powered down.

At processing block 320, the burn-in test is performed for the enabled component block. At processing block 330, the first component block is powered down by PCU 250 removing the enable signal from the corresponding gate transistor once the burn-in test for the component block has been completed. At decision block 340, it is determined whether there is another component block to be tested.

If so, control is returned to processing block 310 where a second component block (e.g., core 222) is powered up upon the corresponding gate transistor receiving an enable signal from PCU 250. Otherwise, the sequential burn-in process has been completed due to the sequential burn-in testing of each component block. According to one embodiment, uncore 224 remains on during sequential burn-in in order to keep DUT 150 operational during burn-in. Thus, only turn off cores 220 and 222, and graphics core 226 are sequentially turned off to reduce power requirements.

The above-described sequential burn-in mechanism significantly reduces burn-in time.

Figure 4:
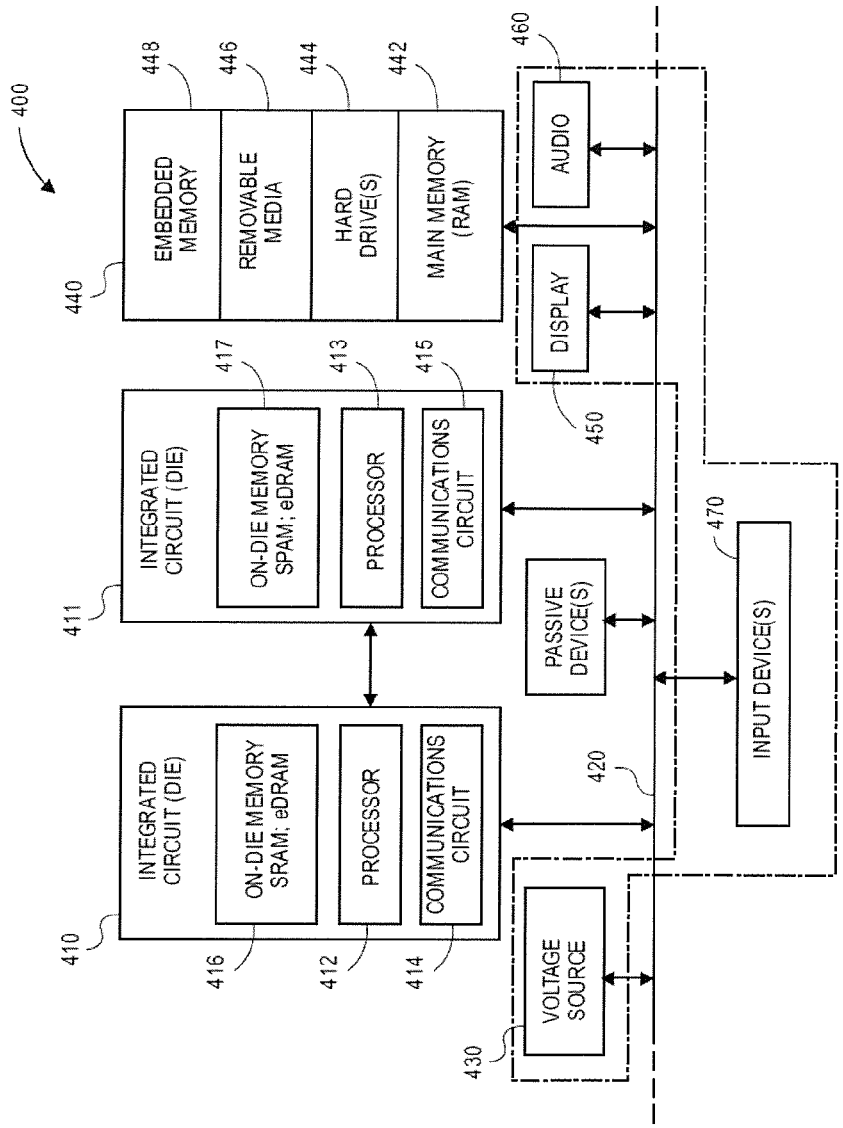
FIG. 4 illustrates one embodiment of a computer system.

FIG. 4 illustrates one embodiment of a computer system 400. The computer system 400 (also referred to as the electronic system 400) as depicted can embody a test system that includes an ATE system and a DUT to perform sequential burn-in testing.

The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be a server system. The computer system 400 may be a supercomputer or high-performance computing system.

In an embodiment, the electronic system 400 is a computer system that includes a system bus 420 to electrically couple the various component blocks of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 610 through the system bus 420.

The integrated circuit 410 is electrically coupled to the system bus 420 and includes any circuit, or combination of circuits according to an embodiment. In an embodiment, the integrated circuit 410 includes a processor 412 that can be of any type. As used herein, the processor 412 may mean any type of circuit such as, but not limited to, a microprocessor, a microcontroller, a graphics processor, a digital signal processor, or another processor. In an embodiment, the processor 412 includes a DUT to perform sequential burn-in testing, as disclosed herein. In an embodiment, SRAM embodiments are found in memory caches of the processor. Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems, or a communications circuit for servers. In an embodiment, the integrated circuit 410 includes on-die memory 416 such as static random-access memory (SRAM). In an embodiment, the integrated circuit 410 includes embedded on-die memory 416 such as embedded dynamic random-access memory (eDRAM).

In an embodiment, the integrated circuit 410 is complemented with a subsequent integrated circuit 411. Useful embodiments include a dual processor 413 and a dual communications circuit 415 and dual on-die memory 417 such as SRAM. In an embodiment, the dual integrated circuit 410 includes embedded on-die memory 417 such as eDRAM.

In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448 such as the first die in an embedded TSV die stack, according to an embodiment.

In an embodiment, the electronic system 400 also includes a display device 450, an audio output 460. In an embodiment, the electronic system 400 includes an input device such as a controller 470 that may be a keyboard, mouse, trackball, game controller, microphone, voice-recognition device, or any other input device that inputs information into the electronic system 400. In an embodiment, an input device 470 is a camera. In an embodiment, an input device 470 is a digital sound recorder. In an embodiment, an input device 470 is a camera and a digital sound recorder.

As shown herein, the integrated circuit 410 can be implemented in a number of different embodiments, including a test system that includes an ATE system and a DUT to perform sequential burn-in testing, and their equivalents, an electronic system, a computer system, one or more methods of fabricating an integrated circuit, and one or more methods of fabricating an electronic assembly that includes a semiconductor die packaged according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed semiconductor die packaged with a thermal interface unit and their equivalents. A foundation substrate may be included, as represented by the dashed line of FIG. 4. Passive devices may also be included, as is also depicted in FIG. 4.

Although embodiments of the invention have been described in language specific to structural features and/or methodological acts, it is to be understood that claimed subject matter may not be limited to the specific features or acts described. Rather, the specific features and acts are disclosed as sample forms of implementing the claimed subject matter.

What is claimed is:

1. An integrated circuit (IC) comprising:
   a first component block;
   a second component block; and
   a power control unit (PCU) coupled to the first and second component blocks to perform a burn-in test of the IC by removing power from the second component block and applying a maximum burn-in voltage and temperature to the first component block, wherein performing the burn-in test of the IC further comprises removing power from the first component block and applying the maximum burn-in voltage and temperature to the second component block;
   a first gate transistor coupled between the first component block and the PCU; and
   a second gate transistor coupled between the second component block and the PCU.

2. The IC of claim 1 wherein the PCU transmits an enable signal to the first and second gate transistors apply the maximum burn-in voltage.

3. The IC of claim 1 further comprising a third component block coupled to the PCU.

4. The IC of claim 3 wherein performing the burn-in test of the IC further comprises removing power from the third component block while applying the maximum burn-in voltage and temperature to the first component block or the second component block.

5. The IC of claim 4 wherein performing the burn-in test of the IC further comprises removing power from the first component block and the second component block while applying the maximum burn-in voltage and temperature to the third component block or the second component block.

6. The IC of claim 5 wherein the first component block and second component block are processing cores and the third component block is a graphics core.

7. The IC of claim 3 wherein performing the burn-in test of the IC further comprises applying power to the third component block while applying the maximum burn-in voltage and temperature to the first component block or the second component block.

8. A test system comprising:
   an automated test equipment (ATE) system;
   an integrated circuit (IC) device coupled the ATE system for testing, including:
      a first component block;
      a second component block; and
      a power control unit (PCU) coupled to the first and second component blocks to perform a burn-in test of the IC under control of the ATE system by removing power from the second component block and applying a maximum burn-in voltage and temperature to the first component block, wherein performing the burn-in test of the IC further comprises removing power from the first component block and applying the maximum burn-in voltage and temperature to the second component block;
      a first gate transistor coupled between the first component block and the PCU; and
      a second gate transistor coupled between the second component block and the PCU.

9. The test system of claim 8 wherein the PCU transmits an enable signal to the first and second gate transistors apply the maximum burn-in voltage.

10. The test system of claim 8 wherein the IC further comprises a third component block coupled to the PCU.

11. The test system of claim 10 wherein performing the burn-in test of the IC further comprises removing power from the third component block while applying the maximum burn-in voltage and temperature to the first component block or the second component block.

12. The test system of claim 11 wherein performing the burn-in test of the IC further comprises removing power from the first component block and the second component block while applying the maximum burn-in voltage and temperature to the third component block or the second component block.

13. The test system of claim 12 wherein the first component block and second component block are processing cores and the third component block is a graphics core.

14. The test system of claim 10 wherein performing the burn-in test of the IC further comprises applying power to the third component block while applying the maximum burn-in voltage and temperature to the first component block or the second component block.

* * * * *